US011133305B2

United States Patent
Ando et al.

(10) Patent No.: US 11,133,305 B2
(45) Date of Patent: Sep. 28, 2021

(54) NANOSHEET P-TYPE TRANSISTOR WITH OXYGEN RESERVOIR

(71) Applicant: International Business Machines Corporation, Armonk, NY (US)

(72) Inventors: Takashi Ando, Tuckahoe, NY (US); Jingyun Zhang, Albany, NY (US); Choonghyun Lee, Rensselaer, NY (US)

(73) Assignee: International Business Machines Corporation, Armonk, NY (US)

( * ) Notice: Subject to any disclaimer, the term of this patent is extended or adjusted under 35 U.S.C. 154(b) by 190 days.

(21) Appl. No.: 16/412,743

(22) Filed: May 15, 2019

(65) Prior Publication Data

US 2020/0365584 A1 Nov. 19, 2020

(51) Int. Cl.
| | |
|---|---|
| *H01L 27/088* | (2006.01) |
| *H01L 29/06* | (2006.01) |
| *H01L 29/16* | (2006.01) |
| *H01L 29/66* | (2006.01) |
| *H01L 29/78* | (2006.01) |

(Continued)

(52) U.S. Cl.
CPC .... *H01L 27/0886* (2013.01); *H01L 21/02532* (2013.01); *H01L 21/02603* (2013.01); *H01L 21/28088* (2013.01); *H01L 21/823412* (2013.01); *H01L 21/823431* (2013.01); *H01L 21/823437* (2013.01); *H01L 21/823481* (2013.01); *H01L 29/0649* (2013.01); *H01L 29/0673* (2013.01); *H01L 29/16* (2013.01); *H01L 29/4966* (2013.01); *H01L 29/6681* (2013.01); *H01L 29/7851* (2013.01)

(58) Field of Classification Search
CPC combination set(s) only.
See application file for complete search history.

(56) References Cited

U.S. PATENT DOCUMENTS

| | | |
|---|---|---|
| 8,643,113 B2 | 2/2014 | Chambers |
| 9,406,678 B2 | 8/2016 | Ji |

(Continued)

OTHER PUBLICATIONS

Cartier, The Role of Oxygen in the Development of Hf-base High-k/Metal Gate Stacks for CMOS Technologies, ECS Transactions, 33(3), 2010, pp. 83-94.

(Continued)

*Primary Examiner* — Mark W Tornow
*Assistant Examiner* — Priya M Rampersaud
(74) *Attorney, Agent, or Firm* — Alexander G. Jochym

(57) ABSTRACT

An approach provides a semiconductor structure for a p-type field effect transistor that includes a nanosheet stack with a top protective layer composed of a plurality of oxygen reservoir layers between a plurality of channel layers, wherein the nanosheet stack is a semiconductor substrate adjacent to one or more isolation structures. The approach includes an interfacial material is around each layer of the plurality of channel layers and on the semiconductor substrate and a layer of gate dielectric material that is over the interfacial material, the top protective layer, and on the one or more isolation structures. The approach includes a layer of a work function metal is over the gate dielectric material and a liner that is over the nanosheet stack and over the work function metal on each of the one or more isolation structures that is covered by a low resistivity metal layer.

10 Claims, 8 Drawing Sheets

(51) Int. Cl.
*H01L 21/28* (2006.01)
*H01L 21/02* (2006.01)
*H01L 21/8234* (2006.01)
*H01L 29/49* (2006.01)

(56) References Cited

U.S. PATENT DOCUMENTS

| | | | |
|---|---|---|---|
| 9,905,672 | B2 | 2/2018 | Wang |
| 9,997,519 | B1* | 6/2018 | Bao .................... H01L 29/4966 |
| 10,032,627 | B2 | 7/2018 | Lee |
| 10,109,735 | B2 | 10/2018 | Coquand |
| 10,153,341 | B2 | 12/2018 | Tao |
| 2013/0026546 | A1 | 1/2013 | Favennec |
| 2018/0308986 | A1* | 10/2018 | Chao .................... H01L 21/2255 |
| 2019/0088798 | A1* | 3/2019 | Kim .................... H01L 29/0653 |
| 2019/0181224 | A1* | 6/2019 | Zhang .................... B82Y 10/00 |

OTHER PUBLICATIONS

Frank, "High-k / Metal Gate Innovations Enabling Continued CMOS Scaling", ESSCIRC (ESSCIRC), 2011 Proceedings of the, pp. 50-58.

* cited by examiner

NANOSHEET P-TYPE TRANSISTOR WITH OXYGEN RESERVOIR

BACKGROUND OF THE INVENTION

The present invention relates generally to the field of semiconductor device formation and particularly to the formation of P-type transistors using stacked nanosheets.

Semiconductor device fabrication is a series of processes used to create integrated circuits present in electronic devices such as computers. As device scaling continues to shrink, in accordance with Moore's Law, electrical performance requirements continue to be more important in semiconductor devices. In order to attain both increased circuit density and required electrical performance, semiconductor device fabrication may include using a number of nanosheets composed of very thin layers of semiconductor or other materials in device formation. Commonly, one or more of the nanosheets are personalized and stacked for semiconductor device formation.

SUMMARY

Embodiments of the present invention disclose a semiconductor structure for a p-type field effect transistor that includes a nanosheet stack with a top protective layer composed of a plurality of oxygen reservoir layers between a plurality of channel layers, wherein the nanosheet stack is on a portion of a semiconductor substrate adjacent to one or more isolation structures. Embodiments of the present invention disclose an interfacial material is around each layer of the plurality of channel layers and on a portion of a top surface of the portion of a semiconductor substrate and a layer of gate dielectric material that is over the interfacial material, is around the top protective layer and is over a top surface of the one or more isolation structures. Embodiments of the present invention disclose a layer of a work function metal is over the gate dielectric material and a liner that is over the nanosheet stack and over the work function metal on each of the one or more isolation structures. Embodiments of the present invention disclose a low resistivity metal layer is on the liner to a level above a top surface of the nanosheet stack covering sides of the nanosheet stack.

Embodiments of the present invention provide a method of forming a p-type field effect transistor that includes removing each of a plurality of sacrificial layers in a nanosheet stack, wherein the nanosheet stack is on a portion of a semiconductor substrate adjacent to one or more isolation structures includes a top protective layer over the plurality of sacrificial layers that alternate with a plurality of channel layers in the nanosheet stack. The method includes forming a layer of an interfacial material on each exposed channel surface in the nanosheet stack and on a top surface of the portion of the semiconductor substrate and depositing a layer of a gate dielectric material over the interfacial material, around the top protective layer, and on one or more isolation structures. Furthermore, the method includes depositing a p-type work function metal over the gate electric material and depositing an oxygen reservoir layer over the p-type work function metal. The method includes removing the oxygen reservoir layer from exposed surfaces of the nanosheet stack and the one or more isolation structures while leaving one or more oxygen reservoir layers between one or more layers of the nanosheet stack and depositing a liner over the nanosheet stack and the exposed surface of the p-type work function metal over the one or more isolation structures. Additionally, the method includes depositing a low resistivity metal over the liner to a level above of the top surface of the nanosheet stack.

BRIEF DESCRIPTION OF THE DRAWINGS

The above and other aspects, features, and advantages of various embodiments of the present invention will be more apparent from the following description taken in conjunction with the accompanying drawings.

DETAILED DESCRIPTION

Figure 1:
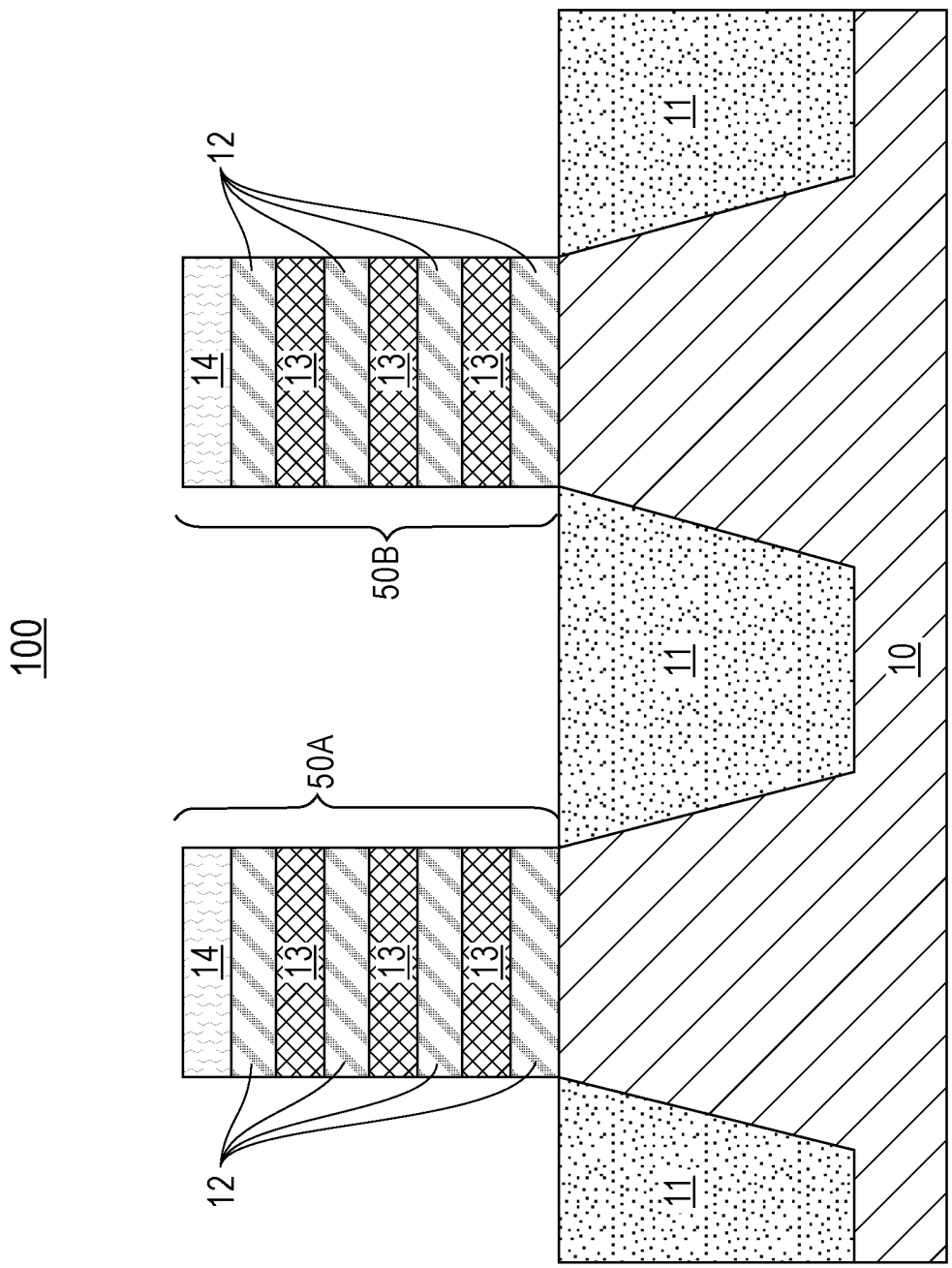
FIG. 1 depicts a cross-sectional view of a semiconductor structure including a substrate with a plurality of isolation structures and two stacks of alternating semiconductor layers with a dummy layer on top of each stack, in accordance with an embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Some of the process steps, depicted, can be combined as an integrated process step. In addition, descriptions of well-known functions and constructions may be omitted for clarity and conciseness.

The terms and words used in the following description and claims are not limited to the bibliographical meanings, but, are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces unless the context clearly dictates otherwise.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Detailed embodiments of the claimed structures and methods are disclosed herein. The method steps described below do not form a complete process flow for manufacturing integrated circuits on semiconductor chips. The present embodiments can be practiced in conjunction with the integrated circuit fabrication techniques for semiconductor chips and devices currently used in the art, and only so much of the commonly practiced process steps are included as are necessary for an understanding of the described embodiments. The figures represent cross-section portions of a semiconductor chip or a substrate, such as a semiconductor wafer during fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment," etc., indicate that the embodiment described may include a particular feature, structure or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Reference will now be made in detail to the embodiments of the present invention, examples of which are illustrated in the accompanying drawings, wherein like reference numerals refer to like elements throughout.

Embodiments of the present invention recognize that there is a need for improving electrical performance in CMOS technology driving a need for one or more of new materials, new semiconductor structures, new semiconductor processes to attain improved electrical performance, particularly as semiconductor device feature size reduction occurs. Embodiments of the present invention recognize that improved electrical performance needs in complimentary metal-oxide semiconductor (CMOS) technology for high performance applications is driving a need for improved threshold voltage in semiconductor devices.

Embodiments of the present invention recognize achieving extremely low threshold voltage is very important for critical paths in CMOS technology in high performance applications. Embodiments of the present invention recognize that dipole engineering is traditionally used for threshold voltage regulation, for example utilizing materials, such as lanthanum oxide (e.g., $La_2O_3$). Embodiments of the present invention recognize some conventional materials, such as aluminum oxide ($Al_2O_3$), are not preferred to lower threshold voltage in p-type field effect transistors (pFET) due to a degradation of carrier mobility using dipole formation.

Embodiments of the present invention recognize achieving a very low threshold voltage using a work function metal provides additional challenges since the equilibrium effective work function, a traditional stack of a low dielectric material, such as hafnium dioxide and titanium nitride, is around 4.9 eV. However, during conventional middle of the line and back end of the line semiconductor processes, an increase in the effective work function occurs moving the effective work function above a stable level.

Embodiments of the present invention recognize using a material, such as silicon germanium (SiGe) for a channel would enable very low threshold voltage, however using SiGe as a channel material would require a dual channel integration with a silicon channel in a n-type field effect transistor (nFET), adding significant process complexity and cost. Embodiments of the present invention recognize that a method and structure to achieve very low threshold voltages in pFET is needed. In particular, embodiments of the present invention recognize that as developments in stacked nanosheets for semiconductor devices continue, a method and structure to achieve very low threshold voltages in pFET formed with a stacked nanosheets and a silicon channel are desired.

The present invention provides a new method and a new structure to achieve very low threshold voltages in pFETs that are stable throughout middle and back end of line FET processing during manufacture and that do not add significant process complexity and associated cost to pFET manufacture. The present invention provides a method and a structure to achieve a very low pFET threshold voltage that is below threshold voltage in conventional pFET structures, nanosheet stacks are formed with one or more of silicon (Si) channels with an interfacial layer, gate dielectric layers (e.g., $HfO_2$), p-type WFM layers (e.g., TiN), and a low resistivity metal layer, such as tungsten (W) that are formed by a standard pFET manufacturing process sequence. The present invention provides a structure and a method that utilizes a TiN or a TiON electrode as a pFET work function metal with an oxygen reservoir, such as a silicon dioxide or silicon oxide nitride, formed over the pFET work function metal.

The present invention provides a structure and a method of forming oxygen reservoir layers such that each layer of the oxygen reservoir layers pinches off or closes any gaps between the oxygen reservoir layer and layers of the pFET work function metal in a nanosheet. The present invention provides a method where the oxygen reservoir layer, originally deposited conformally over a semiconductor structure for pFET device formation, is selectively removed from exposed surfaces of the semiconductor structure and portions of the oxygen reservoir layers are left between the pFET work function metal layers in the nanosheet stack of the semiconductor structure. In other words, the present invention provides selective removal of the oxygen reservoir layers using controlled etch processes on side surfaces of the nanosheet stack for pFET formation and on exposed top surfaces of the pFET work function metal while leaving layers or portions of the oxygen reservoir layers within the nanosheet stack for pFET device formation. The present invention includes providing a deposition of a conventional liner material and a deposition of a low resistivity metal that fills in around and above the nanosheet stack forming the pFET device, and therefore, maintaining a low resistivity path from the low resistivity fill metal to the work function metal.

FIG. 1 depicts a cross-sectional view of semiconductor structure 100 including substrate 10 with a plurality of isolation structures and stack 50A and 50B of alternating material layers with dummy layer 14 on top of each of stack 50A and 50B, in accordance with an embodiment of the present invention. As depicted in FIG. 1, each of stack 50A and 50B is on a portion of substrate 10 adjacent to one or more isolation structures. Additionally, each of stack 50A and 50B contain a number of layers of a sacrificial material that alternate with layers of a channel material and topped with a dielectric material as a protective layer, such as, dummy layer 14. In various embodiments, stacks 50A and 50B are stacks of alternating nanosheets composed of different semiconductor materials topped by a protective layer. While depicted as two stacks 50A and 50B, in other embodiments of the present invention one or more of nanosheet stacks, such as stack 50A and 50B are present. In other words, nanosheet stacks as depicted in FIG. 1 can be any number stacks (e.g., one nanosheet or twenty nanosheet stacks like stacks 50A).

Not depicted in FIG. 1, are source/drains that have been formed into and out of the surface of the paper or drawing sheet of FIG. 1. Channel layer 13 are anchored or attached to the source/drains formed out of and into FIG. 1 drawing sheet surface. For example, channel layer 13 can be attached to an epi layer of source/drains (not depicted in FIG. 1).

Substrate 10 is composed of any semiconductor substrate material suitable for a substrate in pFET device formation. In various embodiments, semiconductor substrate 10 is a silicon semiconductor material. In one embodiment, substrate 10 is composed of germanium or silicon germanium (SiGe). In some embodiments, semiconductor substrate 10 is composed of one of any group III-V semiconductor material, group II-VI semiconductor material, or group IV semiconductor material. In other examples, substrate 10 may be composed of materials including, for example, III-V compound semiconductor materials (e.g., SiC, GaAs, or InAs), ZnTe, CdTe, ZnCdTe, or other II-VI compound semiconductor materials or alloys of GaAlAs, InGaAs, InAlAs, InAlAsSb, InAlAsP, and InGaAsP. In various embodiments, substrate 10 is a wafer or a portion of a wafer. In some embodiments, substrate 10 is one of doped, undoped, or contains doped regions, undoped regions, or defect rich regions. In an embodiment, substrate 10 is one of a layered semiconductor substrate, such as a semiconductor-on-insulator substrate (SOI), Ge on insulator (GeOI) or silicon-on-replacement insulator (SRI).

A plurality of isolation structures, depicted as shallow trench isolation (STI) 11 can be composed of any dielectric material suitable for isolation trench formation (e.g., $SiO_2$). While depicted as three STI 11, a number of STI 11 are not limited to this number but, may be any number of STI 11. For example, as depicted in FIG. 1, stack 50A and 50B of alternating layers of sacrificial layers 12 and channel layer 13 reside on two portions of substrate 10 with one STI 11 between or inside the two portions of substrate 10 with a stack of stack 50A or 50B and two STI 11 each residing on the outside or other side of the two portions of substrate 10. Another example of semiconductor structure for the present invention may include three stacks on three portions of substrate 10 and four STI 11. In yet another example of a semiconductor structure for the present invention may include one portion of substrate 10 with a nanosheet stack and one STI 11 around the portion of substrate 10 with a nanosheet stack.

Sacrificial layer 12 is a layer of sacrificial material. In various embodiments, sacrificial layer 12 is composed of a semiconductor material. For example, sacrificial layer 12 is composed of silicon germanium (SiGe) or another suitable semiconductor material. In an embodiment, sacrificial layer 12 is composed of another material capable of uniform deposition in a nanosheet layer compatible with semiconductor manufacturing processes and suitable for selective etch of sacrificial layers 12 that are between channel layer 13A. As depicted in FIG. 1, a protective layer or dummy layer 14 covers a top layer of sacrificial layer 12 in each stack 50A and 50B.

A thickness of sacrificial layer 12 can be dictated by subsequent process steps and electrical requirements of a completed pFET device. For example, a thickness of sacrificial layer 12 is thick enough to allow selective removal of each of sacrificial layers 12 from stacks 50A and 50B in subsequent process steps and is thick enough to provide enough space between each channel layer 13 for deposition of a high k dielectric layer, a work function metal, and an oxygen reservoir layer between each channel layer 13 and around each channel layer 13 after removal of sacrificial layers 12 in subsequent steps. In various embodiments, a thickness of sacrificial layer 12 is between two and twenty nanometers. In some embodiments, sacrificial layer 12 is greater than twelve nanometers or less than two nanometers. For example, sacrificial layer 12 is four nanometers thick and in another example sacrificial layer 12 is twelve nanometers thick.

While depicted as four layers of sacrificial layer 12, various embodiments of the present invention are not limited to four layers of sacrificial layer 12. For example, stack 50A and 50B may be composed of ten or more layers of sacrificial layer 12 alternating with channel layer 13.

Channel layer 13 can be composed of any semiconductor material suitable for forming a channel in pFET device. In various embodiments, one or more layers of channel layer 13 are in stack 50A and stack 50B. In FIG. 1, each layer of channel layer 13 alternates with layers of sacrificial layer 12 forming stacks 50A and 50B (e.g., one of sacrificial layers 12, channel layer 13, one of sacrificial layers 12, and so on). In various embodiments, channel layer 13 is a layer of silicon for the channel in the pFET device. In other embodiments, channel layer 13 is a III-V semiconductor material but is not limited to these semiconductor materials. For example, channel layer 13 is InGaAs or can be SixGe1-x in another embodiment.

Each layer of channel layer 13 can have a thickness suitable for nanosheet semiconductor processes providing required electrical performance. In various embodiments, a thickness of channel layer 13 is between two and fifteen nanometers but, is not limited to this range of thickness. For example, a thickness of channel layer 13 can be five nanometers although in some examples, the thickness could be more than fifteen nanometers and in other examples a thickness of channel layer 13 is less than two nanometers. While depicted as three layers of channel layer 13, various embodiments of the present invention are not limited to three layers of channel layer 13. For example, stack 50A and 50B each may be composed of ten or more layers of channel layer 13.

Dummy layer 14 is a protective layer covering a top of each of stack 50A and 50B. For example, dummy layer 14 is above a top layer of sacrificial layers 12 in each of stack 50A and 50B. Dummy layer 14 can be any dielectric material suitable to withstand semiconductor processes in pFET device manufacture. For example, dummy layer 14 can be silicon nitride (SiN) as a top protective layer. In other examples, dummy layer 14 can be another nitride material, an oxide material, a material commonly used in spacer formation, or other material commonly used to protect a layer of material in semiconductor manufacture. Dummy layer 14 needs to be thick enough to protect stack 50A and 50B in subsequent semiconductor processing and thin enough to provide required electrical performance of the pFET device upon completion of device manufacture. For example, dummy layer 14 can be between two and twenty nanometers thick.

Stack 50A and 50B are stacks of alternating nanosheets of material layers. In various embodiments, stack 50A and 50B are stacks of alternating nanosheets of semiconductor layers, such as sacrificial layer 12 and channel layer 13 and each stack 50A and 50B have a top protective layer (e.g., dummy layer 14). Stacks 50A and 50B can be composed of any number of alternating layers of sacrificial layers 12 and channel layer 13. In various embodiments, stack 50A and 50B have the same number of layers. In another embodiment, stack 50A and 50B are each composed of a different number of layers. For example, stack 50A is composed of five layers of sacrificial layers 12 and four layers of channel layer 13 while stack 50B is composed of ten layers of sacrificial layers 12 and nine layers of channel layer 13.

In some embodiments, one or more of channel layers of stack 50A and 50B are composed of a different semiconductor material. For example, channel layer 13A composed of a first semiconductor material (e.g., silicon) and channel layer 13B composed of a second semiconductor material (e.g., another semiconductor material, such as InAs or the like) that alternate around sacrificial layer 12. In this example, stack 50A and 50B include two channel layers, such as channel layer 13A and channel layer 13B (not depicted in FIG. 1) that are composed of two different semiconductor materials, where the two semiconductor materials alternate with sacrificial layers 12 (e.g., channel layer 13A, sacrificial layer 12, channel layer 13B, sacrificial layer 12, and so on). In these embodiments, the various layers of channel layers in a nanosheet stack are composed of two or more different channel layer materials in the stack. While the previous example illustrates two different semiconductor materials for channels in the nanosheet stack, two different material is not a limitation. In another example, three different materials (e.g., channel layer 13A, 13B, and 13C not depicted in) are used in channel layers of a nanosheet that alternate with sacrificial layers 12.

Figure 2:
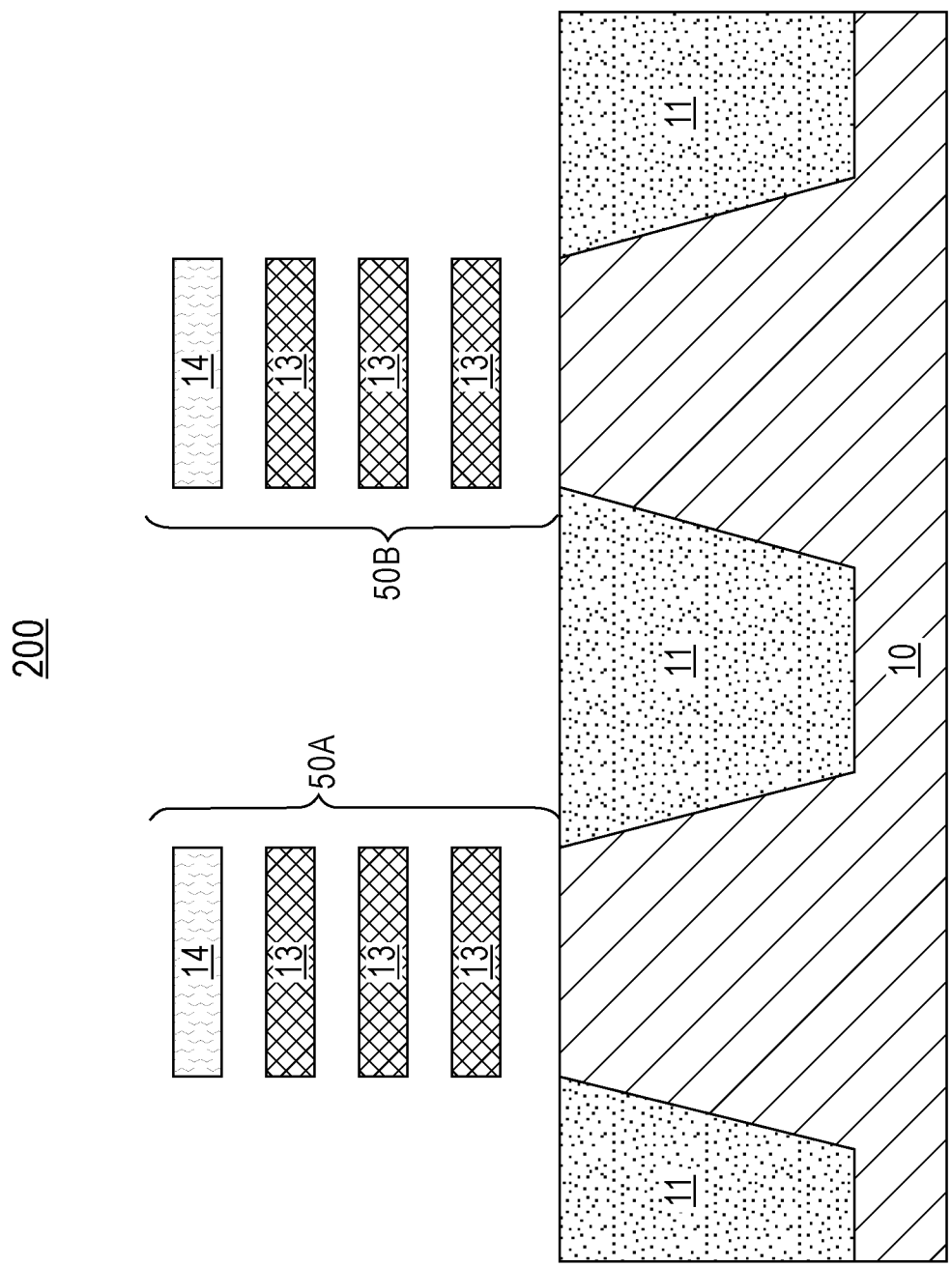
FIG. 2 depicts a cross-sectional view of the semiconductor structure after fabrication steps selectively removing the sacrificial layers in the two stacks of alternating layers of nanosheets, in accordance with an embodiment of the present invention.

FIG. 2 depicts a cross-sectional view of semiconductor structure 200 after fabrication steps selectively removing sacrificial layers 12 in stacks 50A and 50B, in accordance with an embodiment of the present invention. After the removal sacrificial layers 12, each layer of channel layer 13 in stack 50A and 50B remain supported by source/drains (not depicted in FIG. 2) that extend into and out the drawing sheet of FIG. 2.

In various embodiments, sacrificial layers 12 are removed by a wet etch process. For example, a selective etch of sacrificial layers 12 can be done with a hydrochloric acid (HCL) etchant. In other examples, a selective etch of sacrificial layers 12 with another etchant capable of removing sacrificial layers 12 (e.g., using a different etchant chemistry of another semiconductor material or another sacrificial layer 12 material). In some embodiments, a selective gas phase etch process is used to remove sacrificial layers 12.

Figure 3:
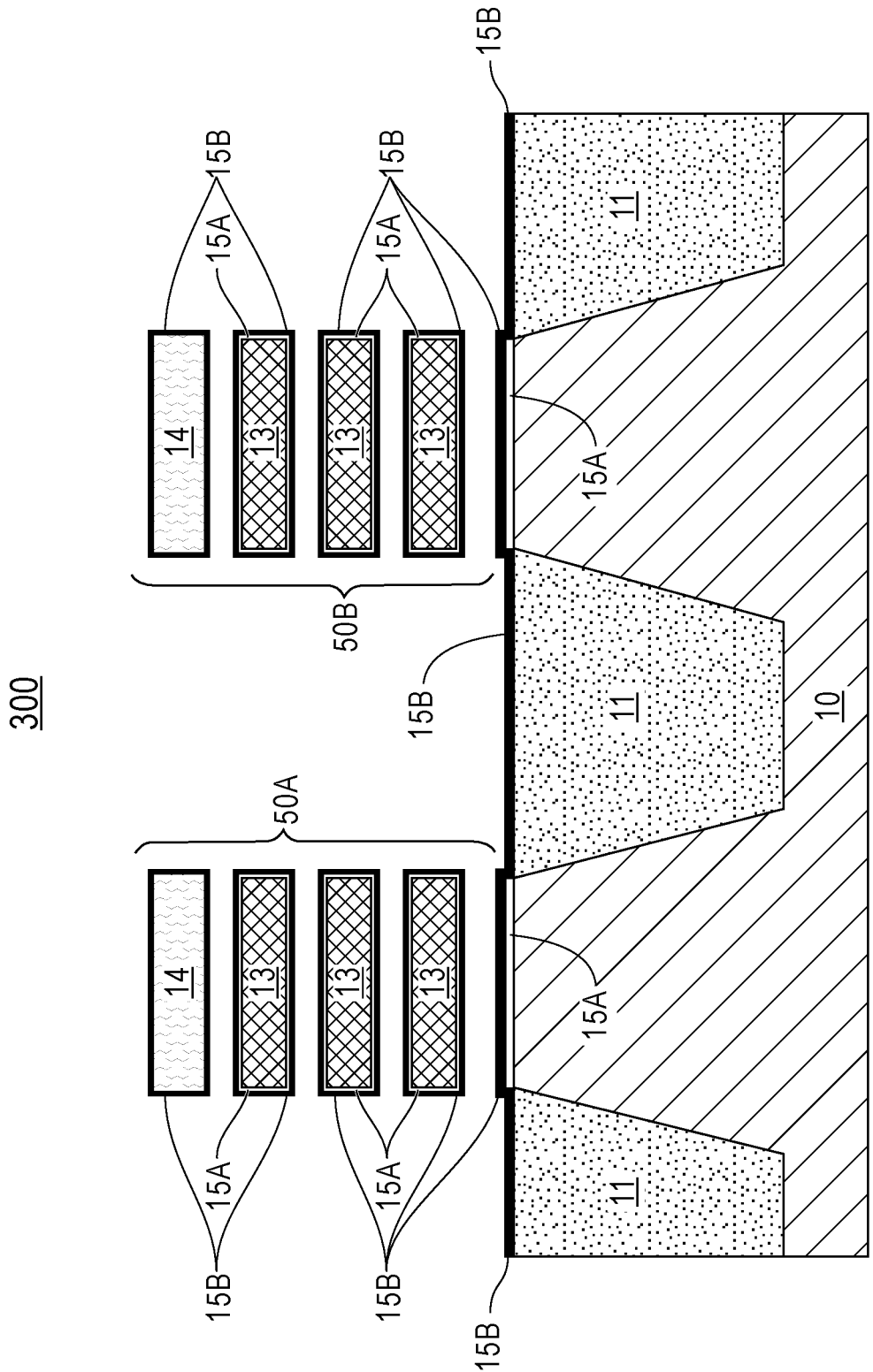
FIG. 3 depicts a cross-sectional view of the semiconductor structure after fabrication steps forming an interfacial layer and a dielectric material on the semiconductor structure, in accordance with an embodiment of the present invention.

FIG. 3 depicts a cross-sectional view of semiconductor structure 300 after fabrication steps forming interfacial layer (IL) 15A and dielectric 15B on the semiconductor structure, in accordance with an embodiment of the present invention. Using conventional processes, IL 15A is deposited or formed on exposed surfaces of substrate 10 and on exposed surfaces of each of channel layer 13 in stack 50A and 50B. In various embodiments, IL 15A is composed of hafnium silicon oxide (HfSiO) and SiON. IL 15A is not limited these materials but, can be any material used for an interfacial layer in a p-type FET.

After completion of IL 15A formation, a layer of dielectric material (e.g., dielectric 15B) is deposited over IL 15A and over STI 11. In various embodiments, dielectric 15B is a high-k dielectric material. In one embodiment, dielectric 15B is deposited over STI 11. Using known deposition methods, such as, but, not limited to atomic layer deposition (ALD), a deposition of a high-k dielectric material for dielectric 15B occurs on the exposed surfaces of semiconductor structure 300, where the exposed surfaces of semiconductor structure 300 include on STI 11, on substrate 10, around channel layer 13, and around dummy layer 14. In various embodiments, dielectric 15B is composed of hafnium dioxide ($HfO_2$).

A conformal deposition of a high k-dielectric material forming dielectric 15B, which can be a gate dielectric material suitable of use as a gate dielectric in a p-type FET. Deposition of dielectric 15B may occur using any suitable deposition technique including, but not limited to ALD, chemical vapor deposition (CVD), plasma enhanced chemical vapor deposition (PECVD), physical vapor deposition (PVD), or other similar deposition processes. Dielectric 15B may be composed of any appropriate high-k gate dielectric material, such as but not limited to, $SiO_2$, $ZrO_2$, $TiO_2$, $Al_2O_3$, $La_2O_3$, $Y_2O_3$, $LaAlO_3$, $HfSiO_2$, and $SrTiO_3$. In one embodiment, dielectric 15B has a thickness in the range of one nanometer to five nanometers. However, in other embodiments, dielectric 15B may be less than one nanometer while in an embodiment, the gate dielectric thickness may be greater than five nanometers.

Figure 4:
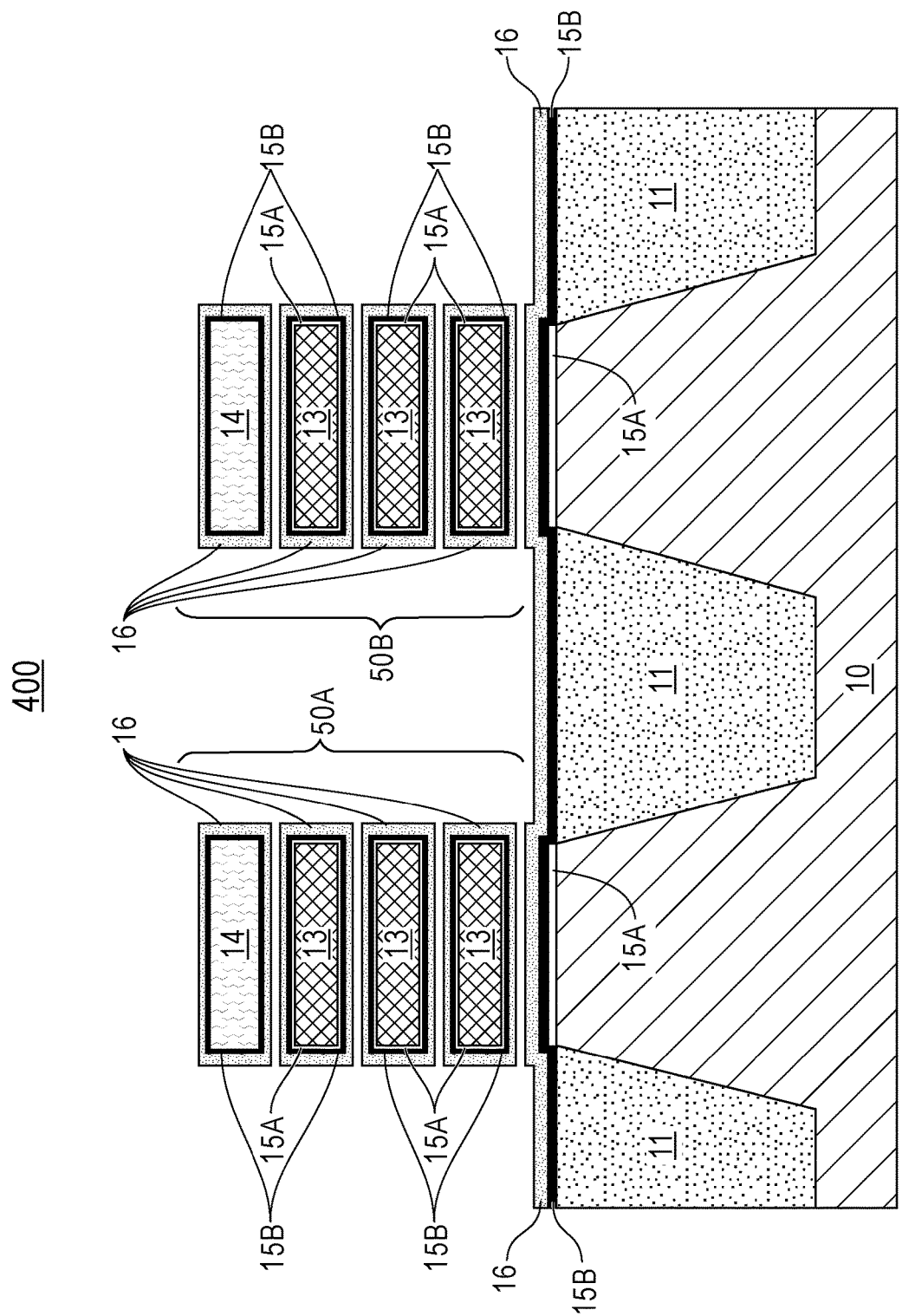
FIG. 4 depicts a cross-sectional view of the semiconductor structure after fabrication steps depositing an oxygen rich work function metal on exposed surfaces of the semiconductor structure, in accordance with an embodiment of the present invention.

FIG. 4 depicts a cross-sectional view of semiconductor structure 400 after fabrication steps depositing an oxygen rich work function metal (WFM) on exposed surfaces of semiconductor structure 400, in accordance with an embodiment of the present invention. In various embodiments, an oxygen rich metal is used for a work function metal deposited on dielectric 15B. For example, WFM 16 can be composed of TiON for an oxygen rich metal, however, WFM 16 is not limited this material or to an oxygen rich metal. In an embodiment, WFM 16 is a WFM, such as TiN (e.g., is not an oxygen rich metal). WFM 16 is not limited to TiN or TiON and maybe composed of another suitable work function metal or an oxygen rich work function metal for gate formation in a pFET device.

WFM 16 can be deposited on dielectric 15B. For example, WFM 16 is deposited on dielectric 15B that is on top surfaces of STI 11, substrate 10, and dielectric 15B that is around channel layer 13 and dummy layer 14 in each of stacks 50A and 50B. In various embodiments, WFM 16 is conformally deposited TiON deposited by ALD. Deposition of WFM 16 can occur by other known deposition methods such as CVD, plasma enhanced CVD, plasma vapor deposition (PVD), molecular beam epitaxy (MBE), metal-organic chemical vapor deposition (MOCVD), or other similar deposition methods. WFM 16 may be any suitable conductive material for a gate electrode, such as, but not limited to, titanium, titanium nitride, tungsten, tantalum, tantalum nitride, platinum, gold, polysilicon, polysilicon germanium, polygermanium, conductive metal alloys, conductive nitrides, conductive oxides, and similar conductive materials or combination of conductive materials or layers. In some embodiments, the gate or gate electrode consisting of polysilicon, polysilicon germanium, or polygermanium may be doped with doping materials such as aluminum, boron, arsenic, phosphorous, antimony, gallium, or mixtures thereof. A thickness of WFM 16 can be one to five nanometers, for example. In an embodiment, WFM 16 thickness is greater than five nanometers or less than a nanometer.

Upon completion of deposition of WFM 16, a gap remains between each of the layers of WFM 16 on each layer of stack 50A and 50B and between a layer of WFM 16 on a channel layer 13 closest to WFM 16 on dielectric 15 in stack 50A and 50B directly over a top portion of substrate 10. In other words, a gap, such as a three nanometer gap, exists between each of WFM 16 on each of channel layer 13, on dummy layer 14, and on portions of substrate 10 under channel layer 13, where each of channel layer 13, dummy layer 14, and substrate 10 that are also covered by IL 15A and dielectric 15B (e.g., that are under WFM 16). The gap remaining between channel layer 13, dummy layer 14, and substrate 10 after deposition of WFM 16 is small enough to allow subsequent processing, such as a deposition of an oxygen reservoir between layers of WFM 16 in a later process step, and is large enough to provide required electrical performance of the pFET device upon completion (e.g., too narrow a gap negatively impacts electrical performance of the pFET device). In various embodiments, the gap between WFM 16 deposited on the various layers of stack 50A and 50B and between a lowest channel layer of channel layer 13 in each of stack 50A and 50B and a top surface of WFM 16 on substrate 10 under stacks 50A and 50B is in the range of 0.5 nanometers and five nanometers. For example, a gap of two nanometers can be formed between each of the layers of WFM 16 deposited on channel layer 13, dummy layer 14, and substrate 10 under stacks 50A and 50B. In various embodiments, a gap of one to five nanometers can be formed between each of the layers of WFM 16 deposited on channel layer 13, dummy layer 14, and substrate 10 under stacks 50A and 50B. In other embodiments, the gap is less than a nanometer or greater than five nanometers.

Figure 5:
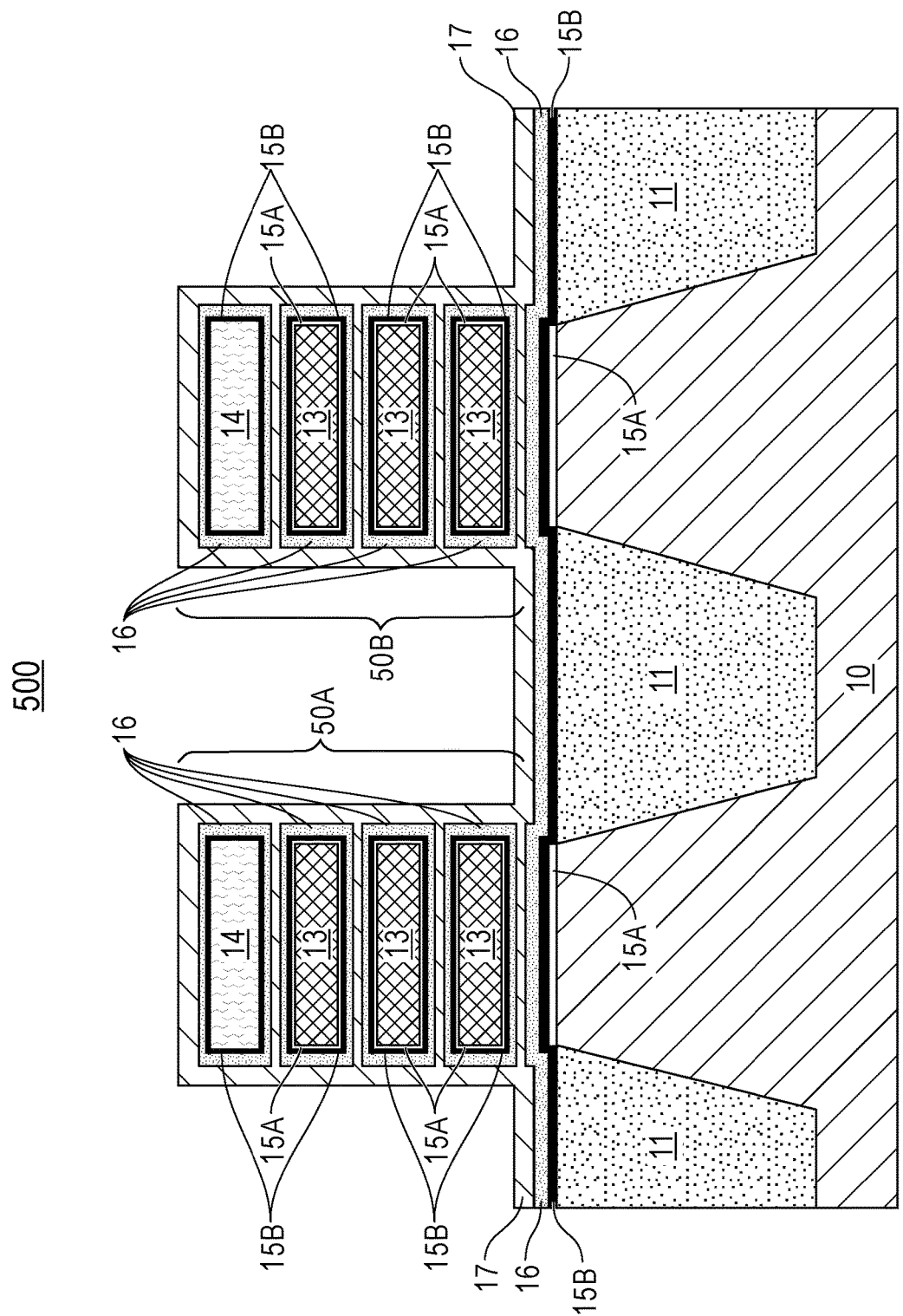
FIG. 5 depicts a cross-sectional view of the semiconductor structure after fabrication steps depositing an oxygen reservoir layer on exposed surfaces of the semiconductor structure, in accordance with an embodiment of the present invention.

FIG. 5 depicts a cross-sectional view of semiconductor structure 500 after fabrication steps depositing an oxygen reservoir layer on exposed surfaces of semiconductor structure 500, in accordance with an embodiment of the present invention. A conformal deposition of a material as an oxygen reservoir layer (ORL 17) occurs on the exposed surfaces of semiconductor structure 500. For example, ORL 17 can be deposited between the various layers of stack 50A and stack 50B and between a bottom layer of stack 50A and 50B (e.g., a layer of WFM 16 around a bottom channel layer of stack 50A and 50B) and a surface of WFM 16 over the top portion of substrate 10 under each of stack 50A and 50B. In various embodiments, ORL 17 is deposited over WFM 16 and fills the space between each of the one or more layers the nanosheet stack, between WFM 16 on each exposed surface of dummy layer 14 and WFM 16 on a channel layer adjacent to or directly beneath dummy layer 14, between WFM 16 on a bottom channel layer 13 of nanosheet stacks 50A and 50B and WFM 16 on the portion of substrate 10 adjacent to or directly beneath nanosheet stack 50A and 50B, and over WFM 16 on the one or more isolation structures.

In various embodiments, ORL 17 is composed of SiO. In some embodiments, ORL 17 may be composed of SiON. ORL 17 is not limited to SiO or SiON but, may be composed of other suitable material capable of providing an oxygen reservoir, such as $TiO_2$ or other suitable oxide material. In one embodiment, one or more layers of ORL 17 are composed of two or more different materials. For example, some layers of ORL 17 are composed of a first material (e.g., ORL 17A, not depicted, such as SiO) and some layers of ORL 17 are composed of a second material (e.g., ORL 17B, not depicted, such as SiON) in one or more of stack 50A and 50B.

In various embodiments, the deposition of ORL 17 pinches off or closes any gaps between the various layers of stack 50A and 50B and a top surface of WFM 16 on portions of substrate 10 under stack 50A and 50B. For example, using ALD, a thickness of ORL 17 deposited is sufficient to provide a solid material stack from the top surface of the top portion of substrate 10 to a top surface of ORL 17 over WFM 16 surrounding dummy layer 14 in each of stack 50A and 50B. In other words, after deposition of ORL 17 there no gaps between the various layers of materials in stack 50A and 50B or over the various layers (e.g., IL 15A, dielectric 15B, WFM 16, ORL 17) over the top portion of substrate 10. As depicted in FIG. 5, upon deposition of ORL 17, a solid structure composed of various layers of stack 50A and 50B reside over WFM 16 on the top portion of substrate 10 under stacks 50A and 50B. In various embodiments, a thickness of ORL 17 is one to five nanometers. In an embodiment, ORL 17 is less than one nanometer or greater than five nanometers.

Figure 6:
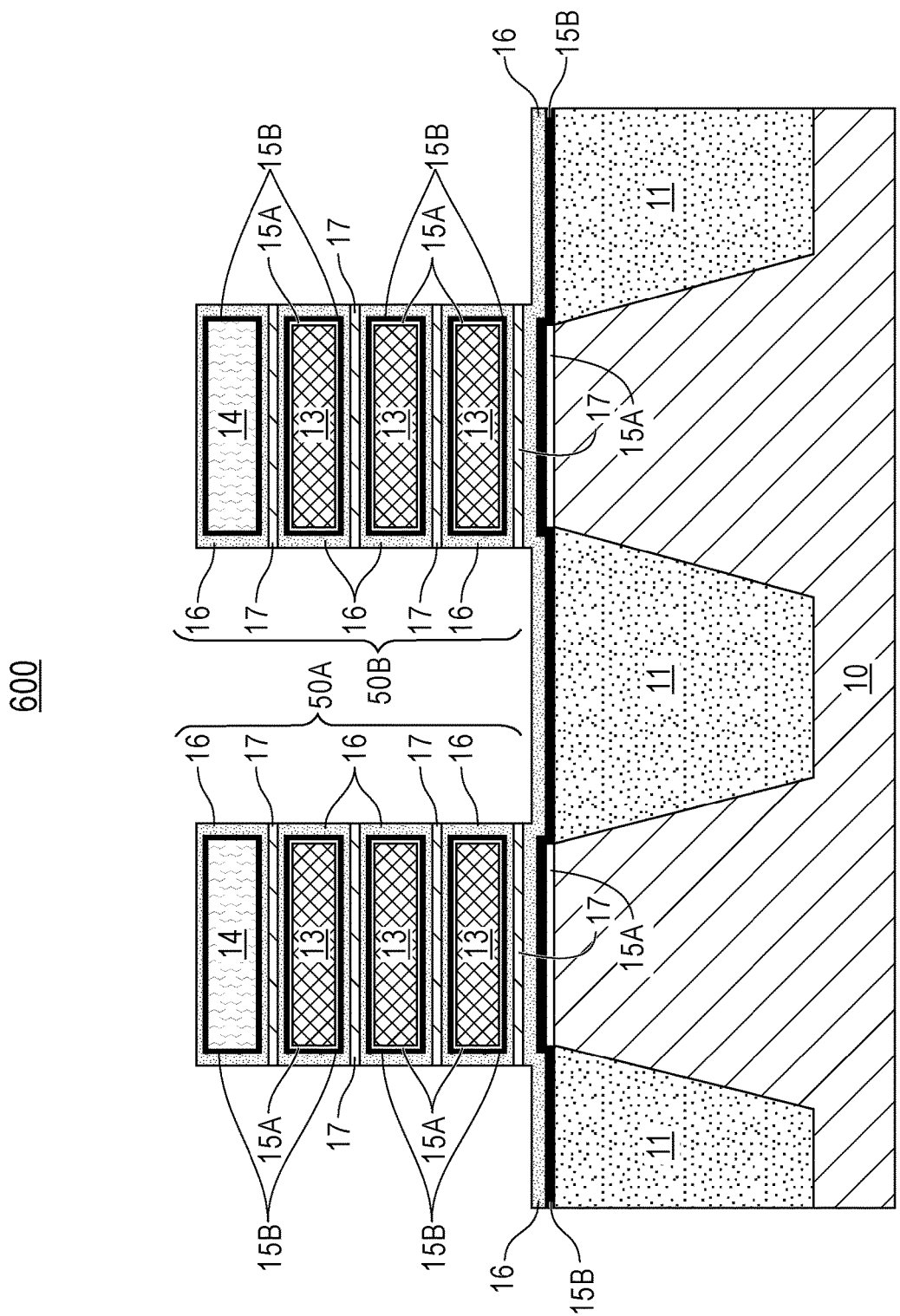
FIG. 6 depicts a cross-sectional view of the semiconductor structure after fabrication steps etching the exposed surfaces of the oxygen reservoir layer in the semiconductor structure, in accordance with an embodiment of the present invention.

FIG. 6 depicts a cross-sectional view of semiconductor structure 600 after fabrication steps etching the exposed surfaces of ORL 17 in semiconductor structure 600, in accordance with an embodiment of the present invention. In various embodiments, a controlled etch process is used to remove ORL 17 from the outer surfaces of stack 50A and 50B and over WFM 16 over exposed top surfaces of STI 11 and substrate 10 in semiconductor structure 600 and that leaves ORL 17 between WFM 16 in or between the various layers (e.g. channel layer 13 and dummy layer 14) of stack 50A and 50B. For example, a wet etch using a dilute HCL etchant with a controlled etch time can be performed to remove ORL 17 from the outer exposed surfaces of stack 50A and 50B while leaving each of the inner layers of ORL 17 between the various layers of stack 50A and 50B and above WFM 16 above the portions of substrate 10 under stack 50A and 50B in place. A controlled etch of ORL 17 on the outer surfaces of semiconductor structure 600 may occur with other etch processes, such as a gaseous etch process, and with other etchants (e.g., is not limited to dilute HCL) that result in layers of ORL 17 remaining between WFM 16 on each of the various layers of stack 50A and 50B and under WFM 16 under a bottom channel layer of channel layer 13. In other words, after the controlled etch process, ORL 17 remains inside each layer of stack 50A and 50B after removing ORL 17 outside of stack 50A and 50B.

Figure 7:
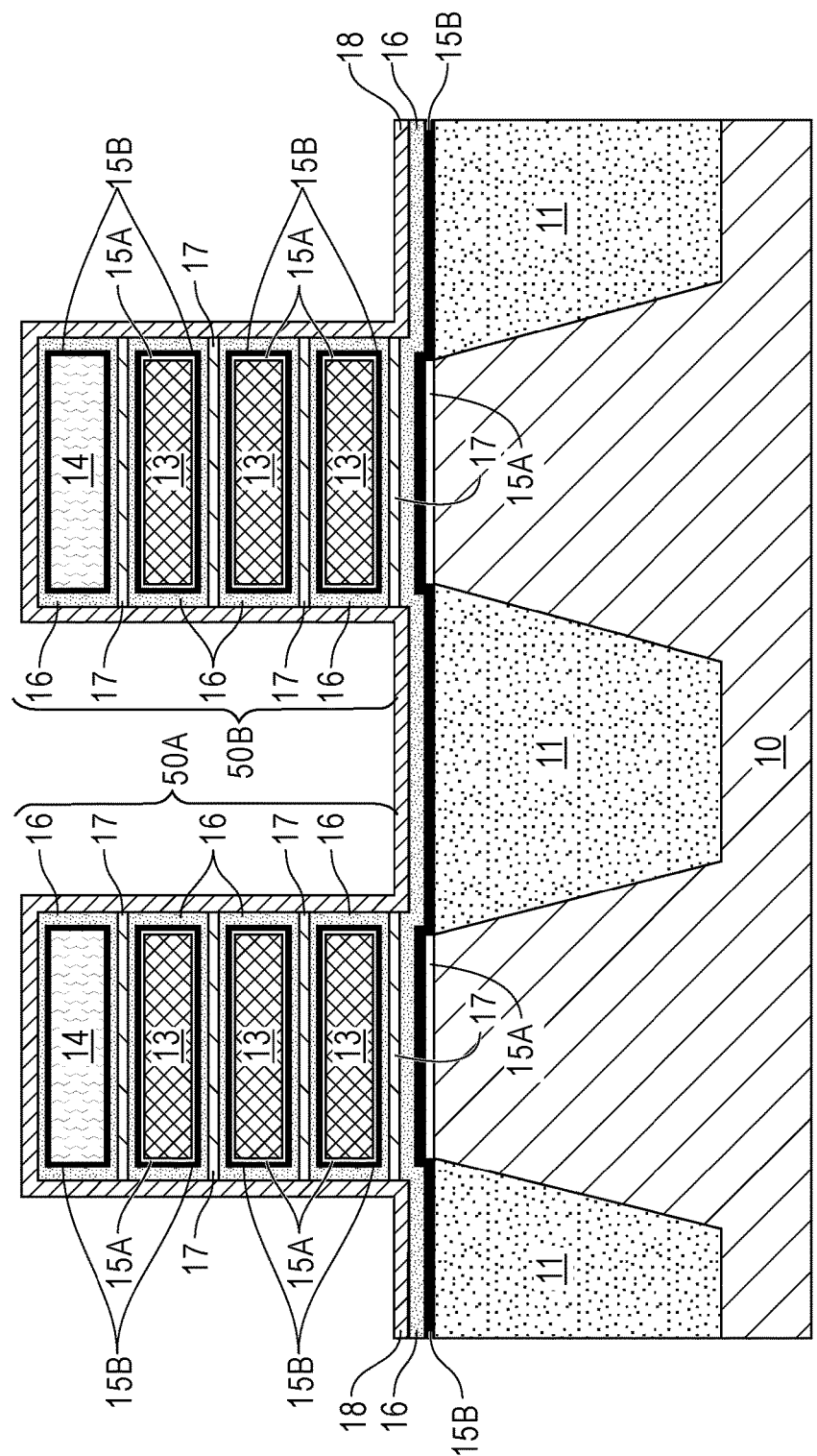
FIG. 7 depicts a cross-sectional view of a semiconductor structure after fabrication steps depositing a liner on the semiconductor structure, in accordance with an embodiment of the present invention.

FIG. 7 depicts a cross-sectional view of semiconductor structure 700 after fabrication steps depositing liner 18 on semiconductor structure 700, in accordance with an embodiment of the present invention. In various embodiments, liner 18 is deposited over semiconductor structure 700. Liner 18 deposited over the exposed surfaces of WFM 16 and ORL 17 (e.g., edges of ORL 17 exposed in stack 50A and 50B). In various embodiments, liner 18 is composed of TiN. In other embodiments, liner 18 is composed of WN or other suitable liner material for a PFET device. Deposition of liner 18 can occur with known deposition processes, such as ALD, CVD, PVD, and the like.

Figure 8:
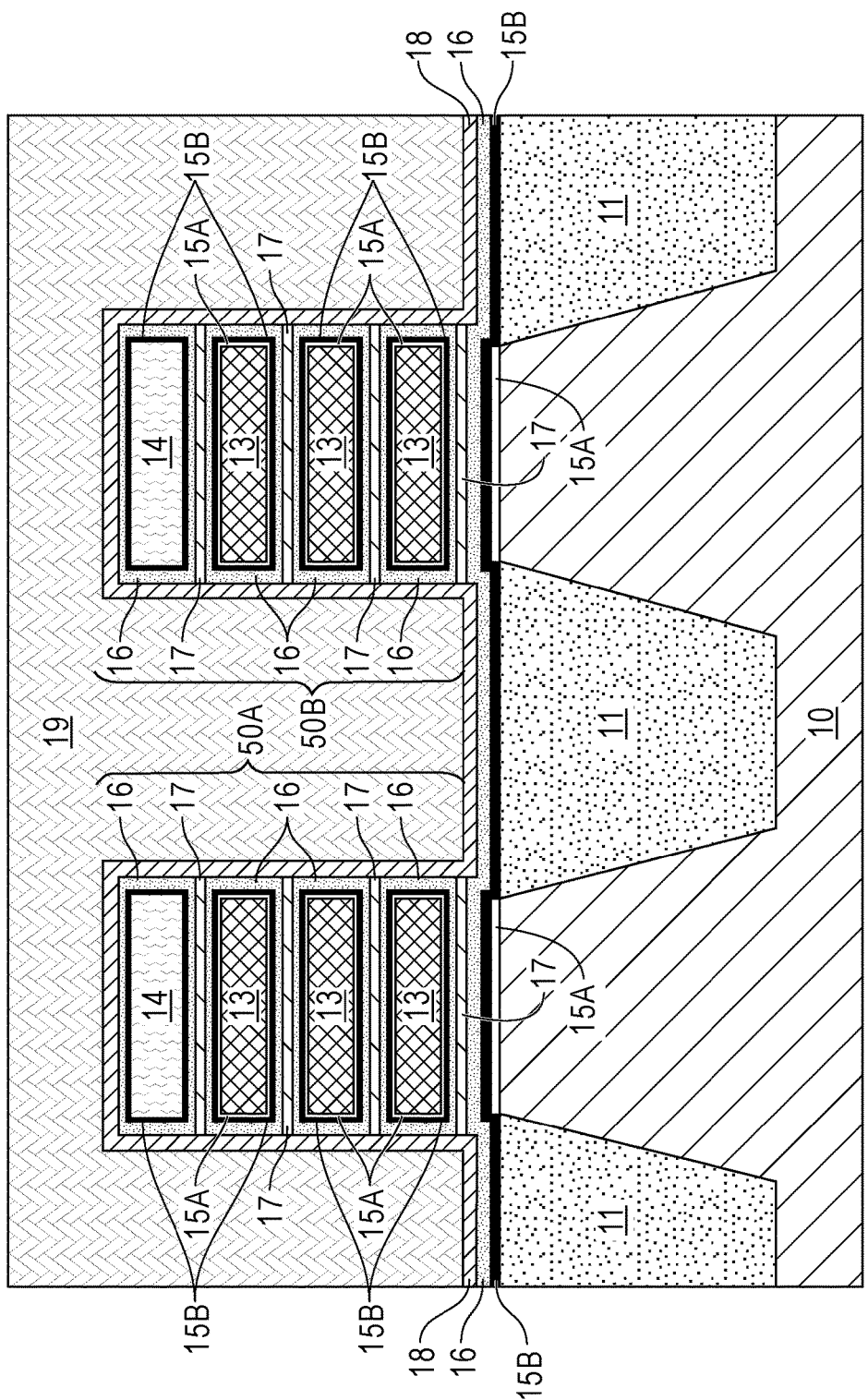
FIG. 8 depicts a cross-sectional view of the semiconductor structure after fabrication steps depositing a layer of a low resistivity metal over the semiconductor structure, in accordance with an embodiment of the present invention.

FIG. 8 depicts a cross-sectional view of semiconductor structure 800 after fabrication steps depositing a layer of a low resistivity metal (LRM 19) over semiconductor structure 800, in accordance with an embodiment of the present invention. Using known deposition methods, LRM 19 is deposited over exposed surfaces of semiconductor structure 800 (e.g., deposited over liner 18). In various embodiments, LRM 19 is deposited on liner 18 to a level above the top surface of stacks 50A and 50B and covering sides of nanosheet stacks 50A and 50B. In other words, LRM 19 is deposited over liner 18 and fills any trenches or wells created between stack 50A and 50B. In one embodiment, LRM 19 is deposited on liner 18 to a level less than the top surface of stacks 50A and 50B (e.g., does not completely fill trenches between stack 50A and 50B) but, still covering the sides and top of stacks 50A and 50B.

In various embodiments, LRM 19 is composed of tungsten. In some embodiments, LRM 19 is composed of other metal materials, such as copper (Cu), cobalt (Co), aluminum (Al), platinum (Pt), gold (Au), tungsten (W), titanium (Ti), or any combination of these metals. LRM 19 is not limited to these metals but, can be any metal, metal compound, or alloy suitable as a low resistivity metal in a PFET device. In some embodiments, the deposition of LRM 19 fills the gap between stack 50A and 50B and covers the top of stacks 50A and 50B. In an embodiment, LRM 19 does not completely fill the gap between stacks 50A and 50B. After depositing LRM 19, the processes will continue with conventional middle of the line (MOD) and back end of line processes (BEOL) in order to complete the pFET transistor device and any addition semiconductor device processing (e.g., wafer dicing and/or chip dicing/packaging). In various embodiments, one or more portions of semiconductor structure 800 is a portion of a PFET device, a p-type finFET device, or a p-type VFET device. The method of creating a p-type PFET device using one or more nanosheet stacks with oxygen reservoirs, as described above, may be used to create a planar PFET, a finFET, or VFET or combination of these semiconductor devices on semiconductor chip or wafer.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A semiconductor structure for a p-type field effect transistor, the structure comprising:
    a nanosheet stack with a top protective layer composed of a plurality of oxygen reservoir layers between a plurality of channel layers, wherein the nanosheet stack is on a portion of a semiconductor substrate adjacent to one or more isolation structures;
    an interfacial material is around each layer of the plurality of channel layers, around each layer of the plurality of oxygen layers, and on a portion of a top surface of the portion of a semiconductor substrate;
    a layer of gate dielectric material is over the interfacial material and is over a top surface of the one or more isolation structures;
    a layer of a work function metal is over the gate dielectric material;
    a liner is over the nanosheet stack and over the work function metal on each of the one or more isolation structures; and
    a low resistivity metal layer is on the liner to a level above a top surface of the nanosheet stack covering sides of the nanosheet stack.

2. The semiconductor structure of claim 1, wherein the plurality of channel layers are composed of a semiconductor material for the p-type field effect transistor.

3. The semiconductor structure of claim 1, wherein each of the plurality of oxygen reservoir layers are composed of one of SiO or SiON.

4. The semiconductor structure of claim 1, wherein each of the plurality of oxygen reservoir layers have a thickness one nanometer to five nanometers.

5. The semiconductor structure of claim 1, wherein the layer of work function metal is a p-type work function metal.

6. The semiconductor structure of claim 5, wherein the layer of work function metal is an oxygen rich p-type work function metal.

7. The semiconductor structure of claim 1, wherein the layer of work function metal is one of TiON or TiN.

8. The semiconductor structure of claim 1, the plurality of channel layers are composed of a p-type semiconductor channel material.

9. The semiconductor structure of claim 1, the plurality of channel layers are composed of a silicon semiconductor material.

10. A semiconductor structure for a p-type field effect transistor with oxygen reservoir layers, the structure comprising:
    a nanosheet stack with a top protective layer composed of a plurality of oxygen reservoir layers between a plurality of channel layers, wherein the nanosheet stack is on a portion of a semiconductor substrate adjacent to one or more isolation structures, and wherein each channel layer is composed of a p-type semiconductor material and more than one p-type semiconductor material is present in the plurality of channel layers;
an interfacial material is around each layer of the plurality of channel layers, around each layer of the plurality of oxygen layers, and on a portion of a top surface of the portion of a semiconductor substrate;
a layer of gate dielectric material is over the interfacial material and is over a top surface of the one or more isolation structures;
a layer of a work function metal is over the gate dielectric material;
a liner is over the nanosheet stack and over the work function metal on each of the one or more isolation structures; and
a low resistivity metal layer is on the liner to a level above a top surface of the nanosheet stack covering sides of the nanosheet stack.

\* \* \* \* \*